United States Patent
Huang

(10) Patent No.: US 11,406,039 B2
(45) Date of Patent: Aug. 2, 2022

(54) ACTIVE HEAT-RADIATING STRUCTURE ATTACHED TO PASSIVE HEAT-RADIATING PART

(71) Applicant: Dynatron Corporation, Union, CA (US)

(72) Inventor: Tai-Chi Huang, Taipei (TW)

(73) Assignee: DYNATRON CORPORATION, Union City, CA (US)

( * ) Notice: Subject to any disclaimer, the term of this patent is extended or adjusted under 35 U.S.C. 154(b) by 249 days.

(21) Appl. No.: 16/845,395

(22) Filed: Apr. 10, 2020

(65) Prior Publication Data

US 2021/0321531 A1    Oct. 14, 2021

(51) Int. Cl.
*G06F 1/20* (2006.01)
*H05K 7/20* (2006.01)

(52) U.S. Cl.
CPC .......... *H05K 7/20172* (2013.01); *G06F 1/20* (2013.01)

(58) Field of Classification Search
CPC ..... H05K 7/20172; G06F 1/20; H01L 23/467; F04D 29/601
See application file for complete search history.

(56) References Cited

U.S. PATENT DOCUMENTS

| | | | | |
|---|---|---|---|---|
| 5,841,633 A | * | 11/1998 | Huang | G06F 1/20 174/16.3 |
| 5,927,389 A | * | 7/1999 | Gonsalves | H05K 7/20172 361/679.48 |
| 10,444,807 B2 | | 10/2019 | Lin et al. | |
| 2003/0214784 A1 | * | 11/2003 | Pauser | H01L 23/467 257/E23.099 |
| 2006/0126302 A1 | * | 6/2006 | Lee | H05K 7/20172 361/695 |
| 2008/0266795 A1 | * | 10/2008 | Kuo | H01L 23/467 361/697 |
| 2010/0212863 A1 | * | 8/2010 | Liu | H01L 23/467 165/80.3 |
| 2017/0075394 A1 | * | 3/2017 | Lin | G06F 1/20 |

* cited by examiner

*Primary Examiner* — Eric S Ruppert
(74) *Attorney, Agent, or Firm* — Muncy, Geissler, Olds & Lowe, P.C.

(57) ABSTRACT

An active heat-radiating structure attached to a passive heat-radiating part comprises a fan, an outer frame, and two mounting members. The outer frame comprises two first connecting portions arranged at two opposite sides of the outer frame, the two mounting members are disposed on the passive heat-radiating part and connected with the outer frame. Each mounting member is provided with a first mounting portion connected with one first connecting portion. Further, each first connecting portion comprises a track provided with a plurality of positioning points and a guide groove disposed in parallel with the track, and each first mounting portion comprises at least one elastic sheet stressed to move on the track and limited by the positioning point, and a guide block stressed to slide in the guide groove. The position of the fan is adjusted by the two first connecting portions and the two first mounting portions.

10 Claims, 8 Drawing Sheets

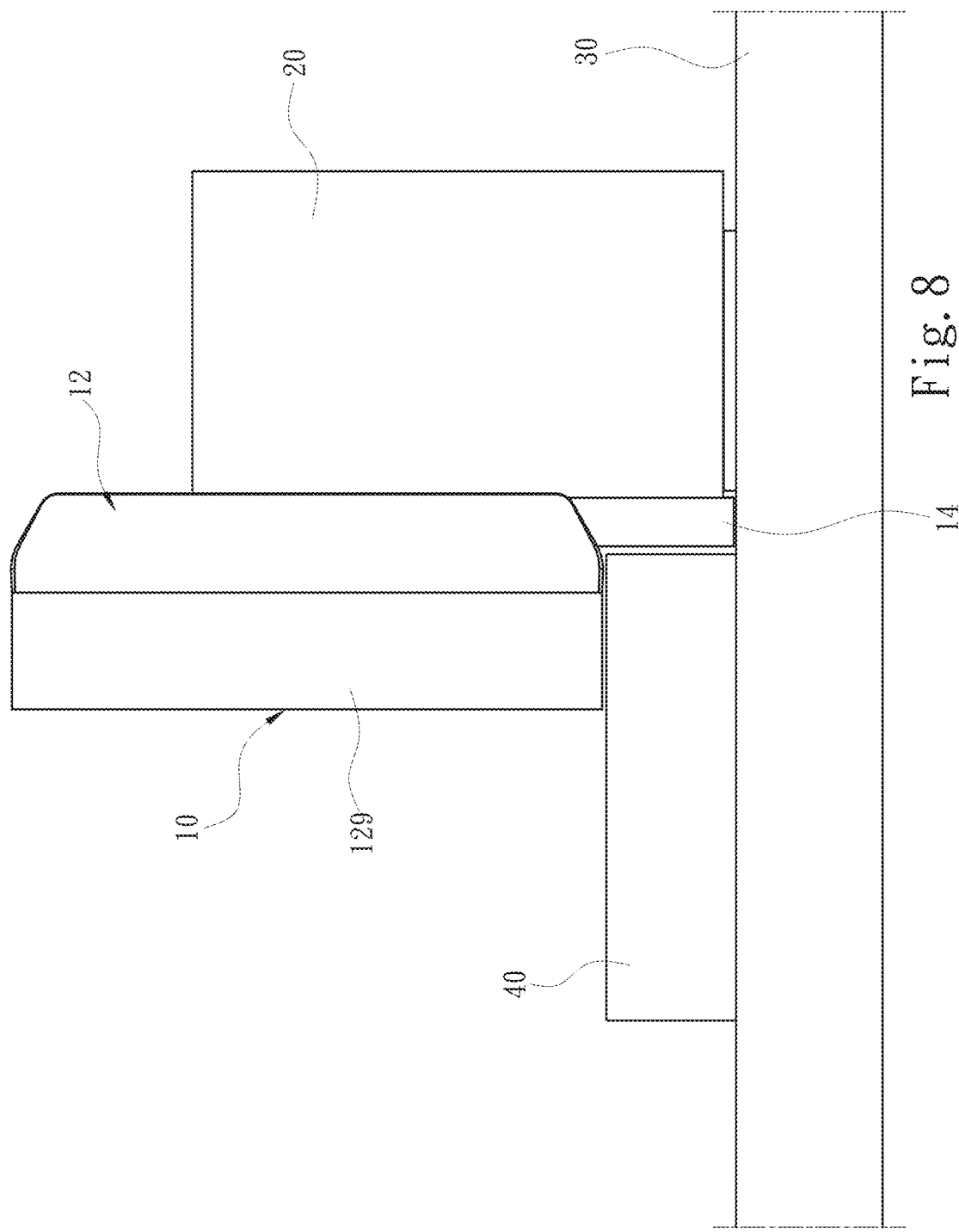

ACTIVE HEAT-RADIATING STRUCTURE ATTACHED TO PASSIVE HEAT-RADIATING PART

FIELD OF THE INVENTION

The invention relates to an active heat-radiating structure, in particular to an active heat-radiating structure which can be attached to a passive heat-radiating part.

BACKGROUND OF THE INVENTION

The existing computer device is equipped with a plurality of electronic components in the internal space of a computer in order to pursue strong computing capability, but the installation of a large number of electronic components in a certain space will cause heat radiating of the components to be difficult. Although vertical radiators are commonly arranged in current computer devices in order to reduce the temperature of the components, it is still difficult to achieve the heat-radiating requirements of the components, so that an active heat-radiating component such as a fan and the like additionally arranged in a limited space becomes an important subject.

Thus, the U.S. Pat. No. 10,444,807 discloses a vertical radiator additionally attached with a fan. However, a fan frame body is required to be separated from a positioning hole by operating a pressing part, then the height of the whole fan is adjusted to a proper position, and the fan frame body is further clamped into another positioning hole to fix the fan. In this way, although the height of the fan relative to the vertical radiator can be adjusted to reduce the space occupied by the fan, the operation requires that the frame be completely separated from the radiator so that the fan can be moved, which is not convenient for a user to operate.

SUMMARY OF THE INVENTION

The main object of the present invention is to solve the problem that a conventional structure cannot enable a user to implement in a quick and convenient manner.

In order to achieve the object, the invention provides an active heat-radiating structure attached to a passive heat-radiating part, comprising a fan, an outer frame provided for the fan to be disposed thereon, and two mounting members. The outer frame comprises two first connecting portions arranged at two opposite sides of the outer frame, the two mounting members are disposed on the passive heat-radiating part and are connected with the outer frame, and each of the mounting members is provided with a first mounting portion facing the outer frame and one of the two first connecting portion. Further, each of the first connecting portions comprises a track provided with a plurality of positioning points and a guide groove disposed in parallel with the track, and each of the first mounting portions comprises at least one elastic sheet which can be stressed to move on the track and limited by one of the positioning points, and a guide block which can be stressed to slide in the guide groove; and the position of the fan relative to the passive heat-radiating part is adjusted by the two first connecting portions and the two first mounting portions.

In an embodiment, the outer frame comprises a frame body connected with the fan and provided with two of the tracks, and two fitting arms positioned at two opposite sides of the frame body and perpendicular to the frame body, each of the fitting arms is provided with one of the guide grooves, and each of the mounting members comprises a first side facing the frame body and provided with the elastic sheet, and a second side facing one of the two fitting arms and provided with the guide block.

In an embodiment, one end of each of the tracks and one end of each of the guide grooves are open ends.

In an embodiment, the outer frame is provided with a plurality of through holes which are respectively formed in the frame body and provided for a fan fastener to penetrate through.

In an embodiment, each of the mounting members is formed with at least one clamping hole for disposing the elastic sheet therein.

In an embodiment, each of the elastic sheets comprises a bent section and two straight sections respectively extending from two ends of the bent section and clamped into each of the clamping holes.

In an embodiment, each of the tracks is provided with a plurality of recesses arranged at intervals to form the plurality of positioning points.

In an embodiment, each of the mounting members comprises two connecting arms respectively extended from both ends respectively.

Accordingly, compared with a conventional technique, the invention is featured that each of the first connecting portions comprises the track and the guide groove, and each of the first mounting portions comprises the elastic sheet and the guide block. During an implementation, the guide block is disposed in the guide groove to limit the fan, so that the fan is prevented from being separated from the passive heat-radiating part. Meanwhile, the elastic sheet is clamped into one of the positioning points of the track, and the height of the fan is adjusted relative to the passive heat-radiating part by changing the positioning point into which the elastic sheet is clamped. Compared with the conventional technique, the height of the fan can be adjusted in a simple and easy manner by merely forcing the first connecting portion to enable the elastic sheet to slide in the track.

BRIEF DESCRIPTION OF THE DRAWINGS

FIG. 8 is a view of an embodiment of the present invention disposed on a circuit board.

DETAILED DESCRIPTION OF THE PREFERRED EMBODIMENTS

The detailed description and technical contents of the present invention are described below with reference to the drawings.

Figure 1:
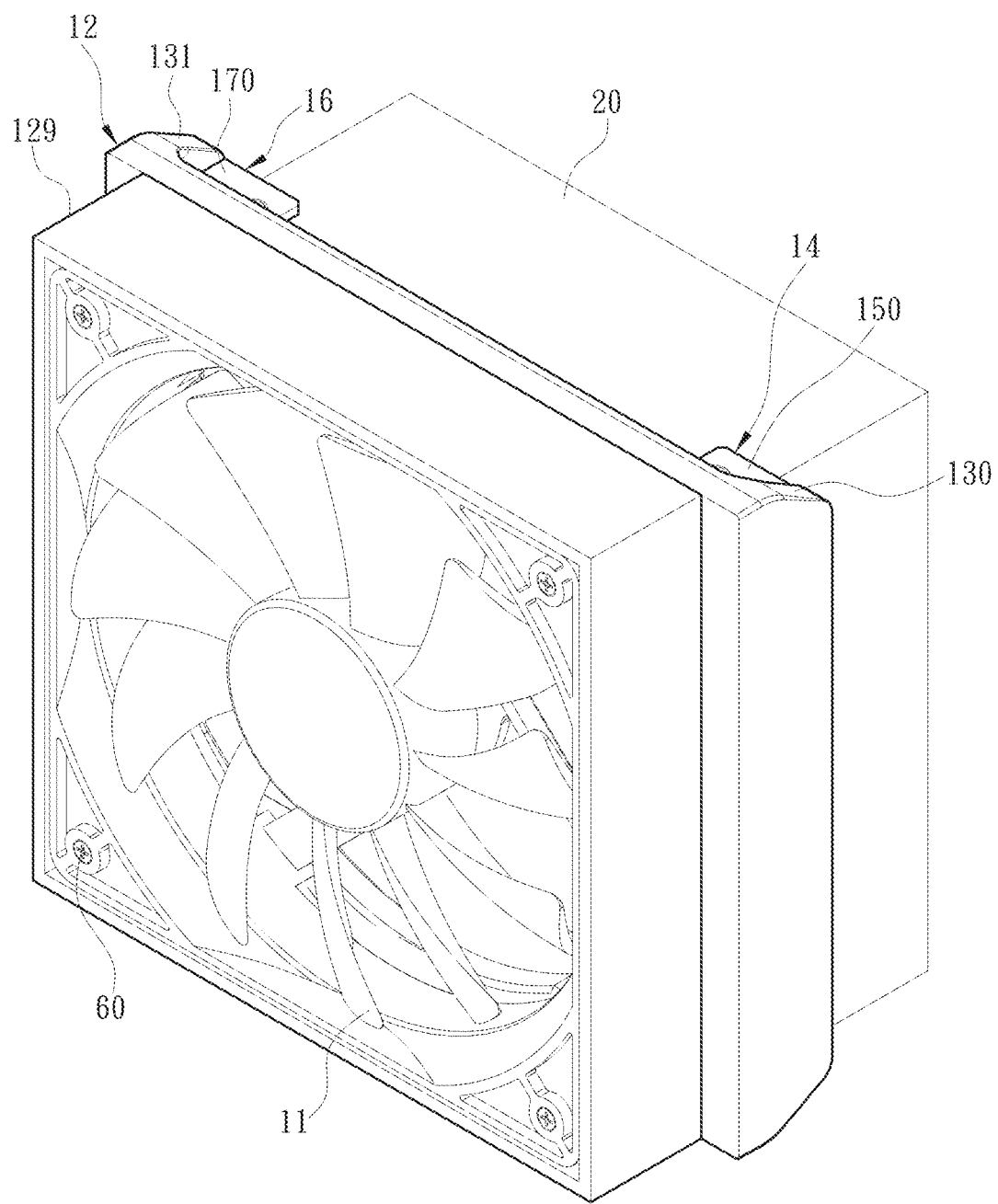
FIG. 1 is a perspective view of the appearance of an embodiment of the present invention.
Figure 2:
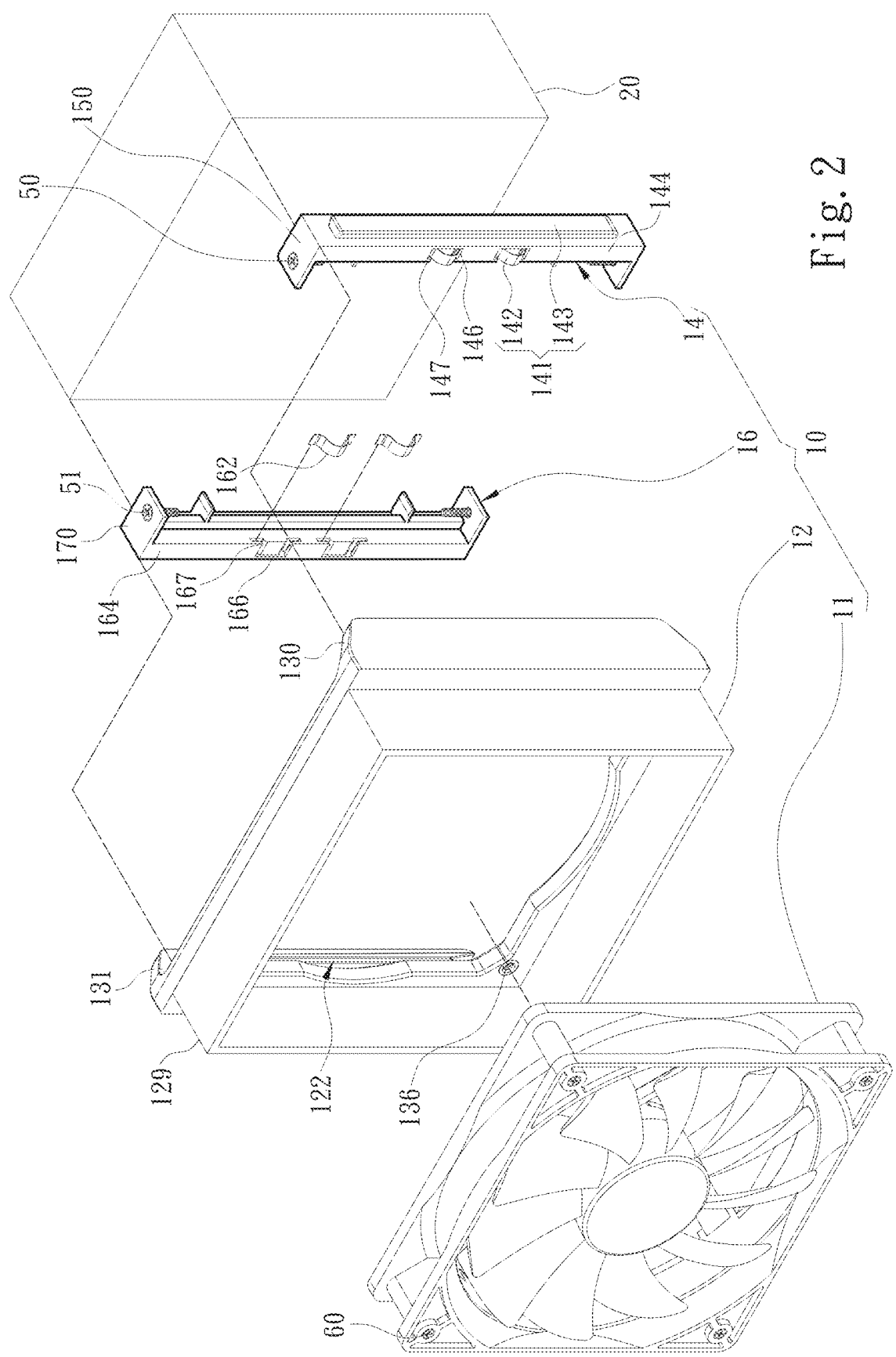
FIG. 2. is an exploded structure view of an embodiment of the present invention.
Figure 3:
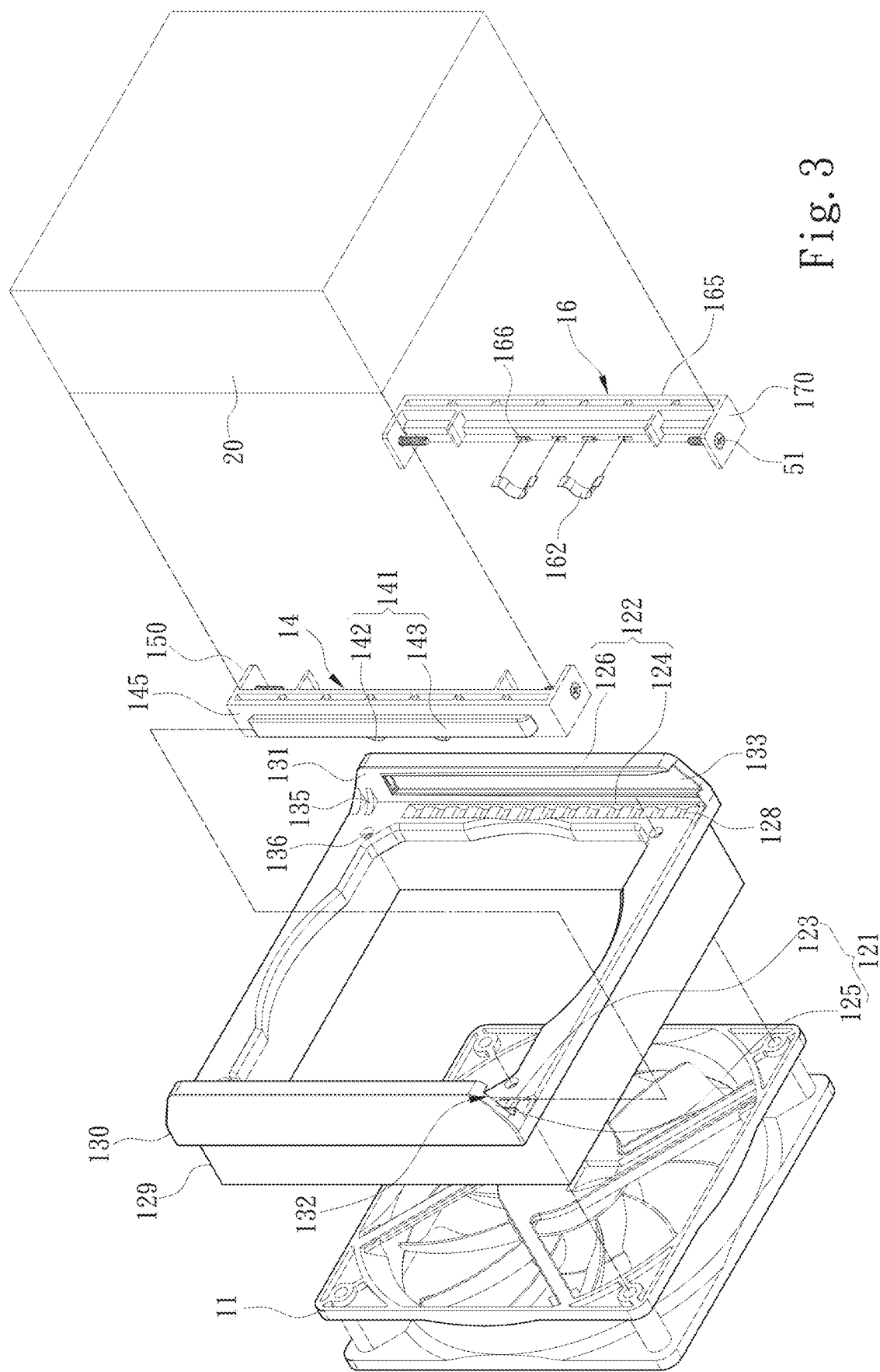
FIG. 3 is an exploded structure view from another perspective of an embodiment of the present invention.
Figure 4:
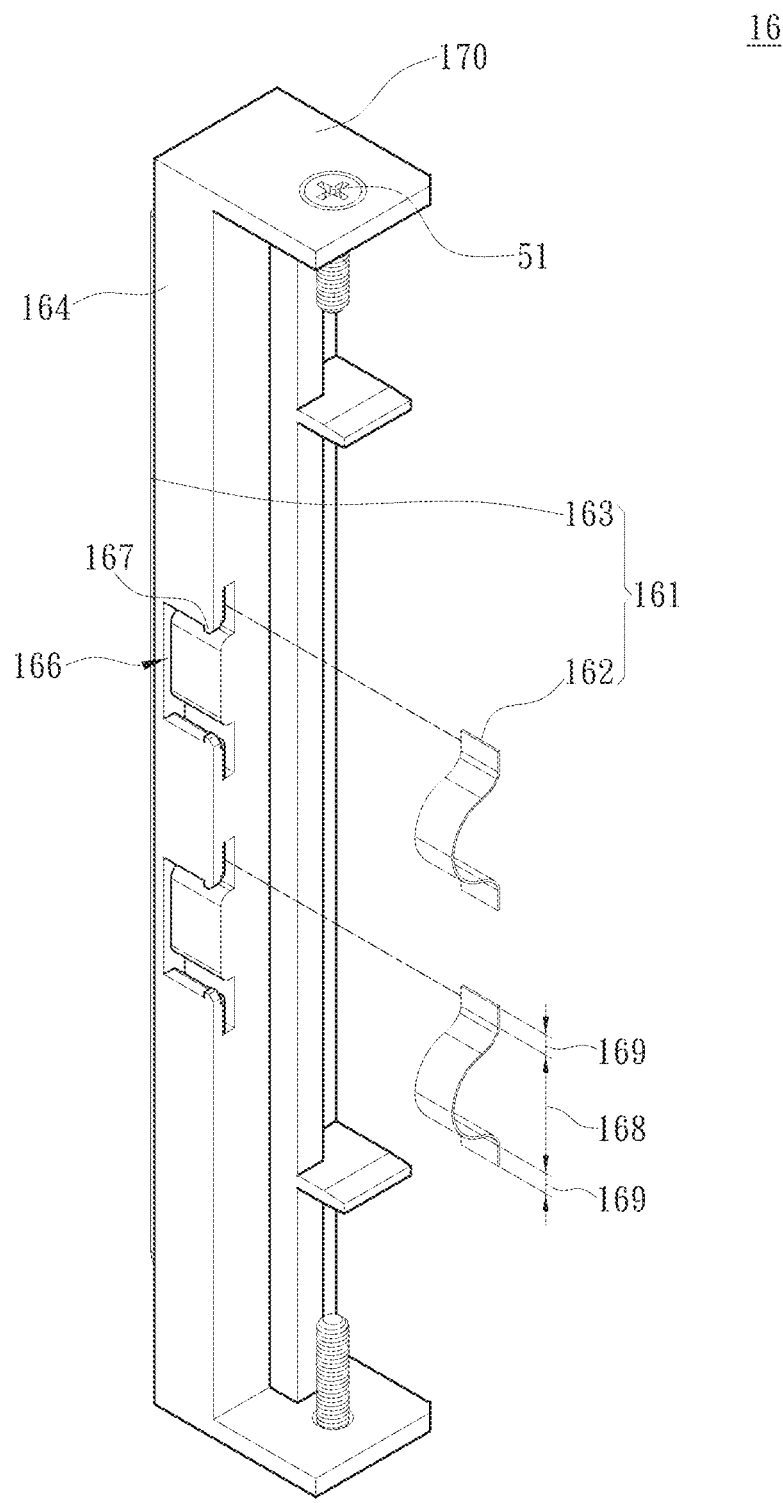
FIG. 4 is a perspective structure view of a mounting member of an embodiment of the present invention.

Referring to FIGS. 1 and 2, the present invention provides an active heat-radiating structure 10 which is attached to a passive heat-radiating part 20, such as a vertical radiator (not shown), and the shape of the passive heat-radiating part 20 is not limited to that depicted in the figures herein.

Also, referring to FIGS. 2, 3, 4, and 5, the active heat-radiating structure 10 comprises a fan 11, an outer frame 12 connected with the fan 11, and two mounting members 14, 16. The outer frame 12 comprises two first connecting portions 121, 122 respectively disposed at outer edges of the outer frame 12 and arranged in parallel with an interval. The two mounting members 14, 16 are disposed on the passive heat-radiating part 20 and correspond to the two first connecting portions 121, 122; and the two mounting members 14, 16 form a connecting relationship with the outer frame 12 to allow the fan 11 to be attached to the passive heat-radiating part 20. Each of the mounting members 14 (16) comprises a first mounting portion 141 (161) facing the outer frame 12, the position of each of the first mounting portions 141 (161) is determined by one of the first connecting portions 121, 122, and each of the first mounting portions 141 (161) is assembled with one of the first connecting portions 121 (122).

Further, each of the first connecting portions 121 (122) comprises a track 123 (124) and a guide groove 125 (126), wherein the track 123 (124) and the guide groove 125 (126) are arranged in parallel, and the position of the track 123 (124) and the guide groove 125 (126) are not limited. For example, the track 123 (124) is disposed at outer edges of the outer frame 12 relative to outer sides of the guide groove 125 (126), or disposed at inner sides of the outer frame 12 relative to the guide groove 125 (126). Also, a plurality of positioning points 127 (128) are provided on the track 123 (124). In an embodiment, the track 123 (124) is provided with a plurality of recesses arranged at intervals to form the plurality of positioning points 127 (128). In addition, each of the first mounting portions 141 (161) comprises at least one elastic sheet 142 (162) and a guide block 143 (163), wherein the elastic sheet 142 (162) is disposed at a position corresponding to the position of the track 123 (124), After the elastic sheet 142 (162) is assembled and positioned in the track 123 (124), the elastic sheet 142 (162) is clamped into one of the plurality of positioning points 127 (128), thereby the elastic sheet 142 (162) is stressed to move within the track 123 (124). Moreover, the guide block 143 (163) is disposed at a position corresponding to the position of the guide groove 125 (126), and the guide block 143 (163) is disposed in the guide groove 125 (126) and is stressed to slide in the guide groove 125 (126). For convenience of explanation to the invention hereinafter, the guide groove 125 (126) is disposed at outsides of the outer frame 12 relative to the track 123 (124), and the guide block 143 (163) is also disposed at outsides of one of the mounting members 14 (16) relative to the guide groove 125 (126).

Figure 5:
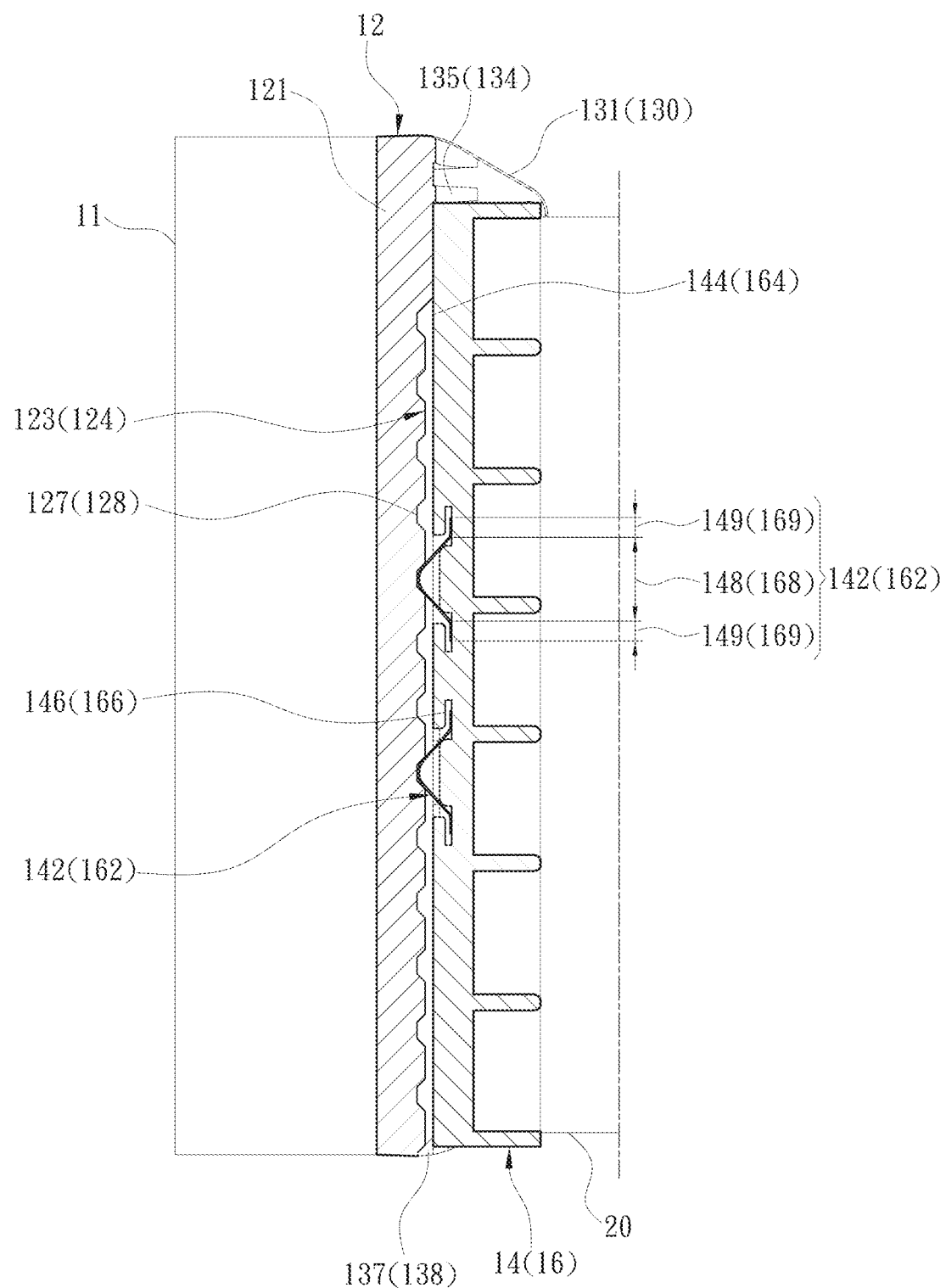
FIG. 5 is one structure cross-sectional view of an embodiment of the present invention.
Figure 6:
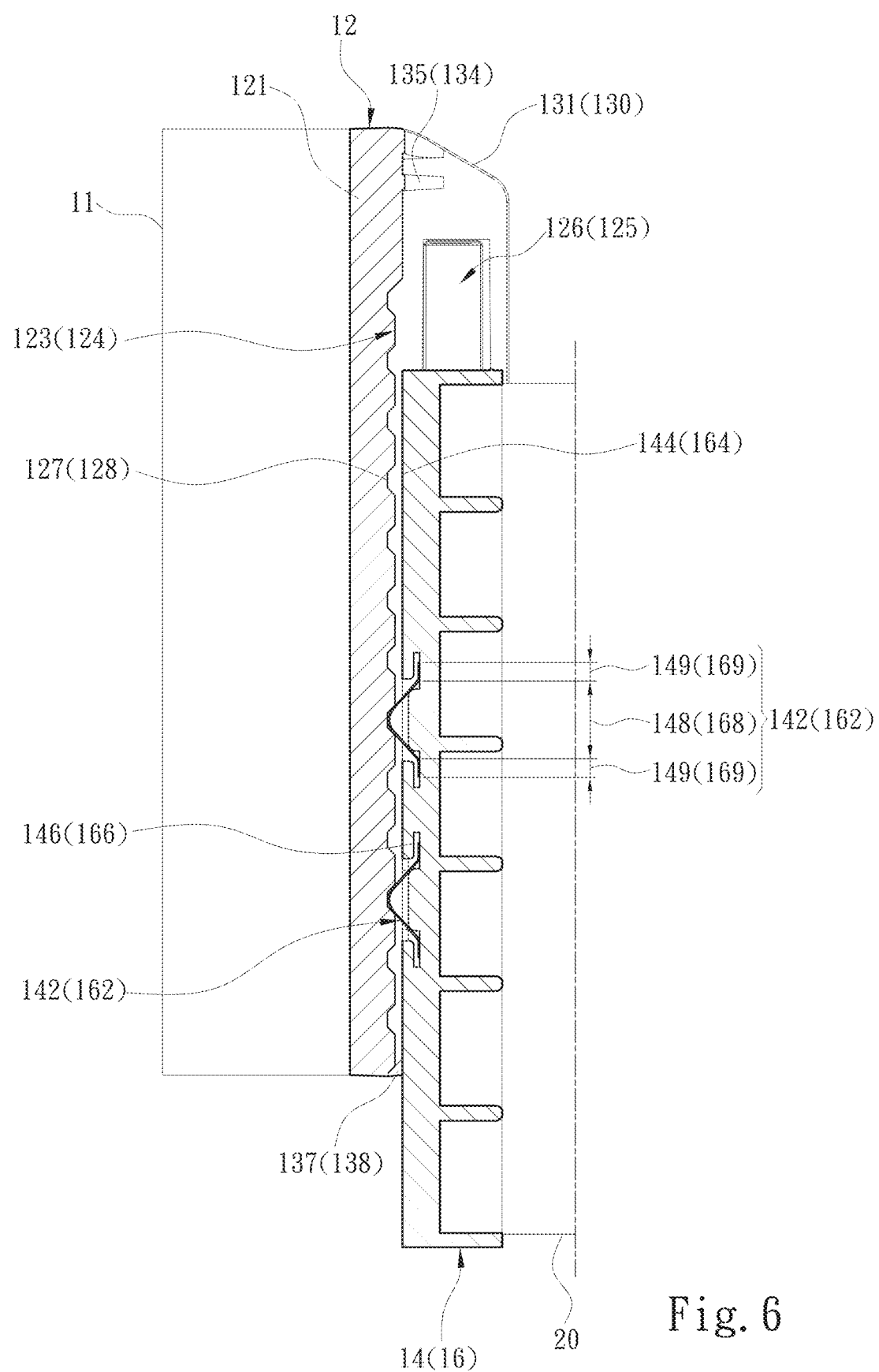
FIG. 6 is a structure cross-sectional view of an embodiment of the present invention when implemented.
Figure 7:
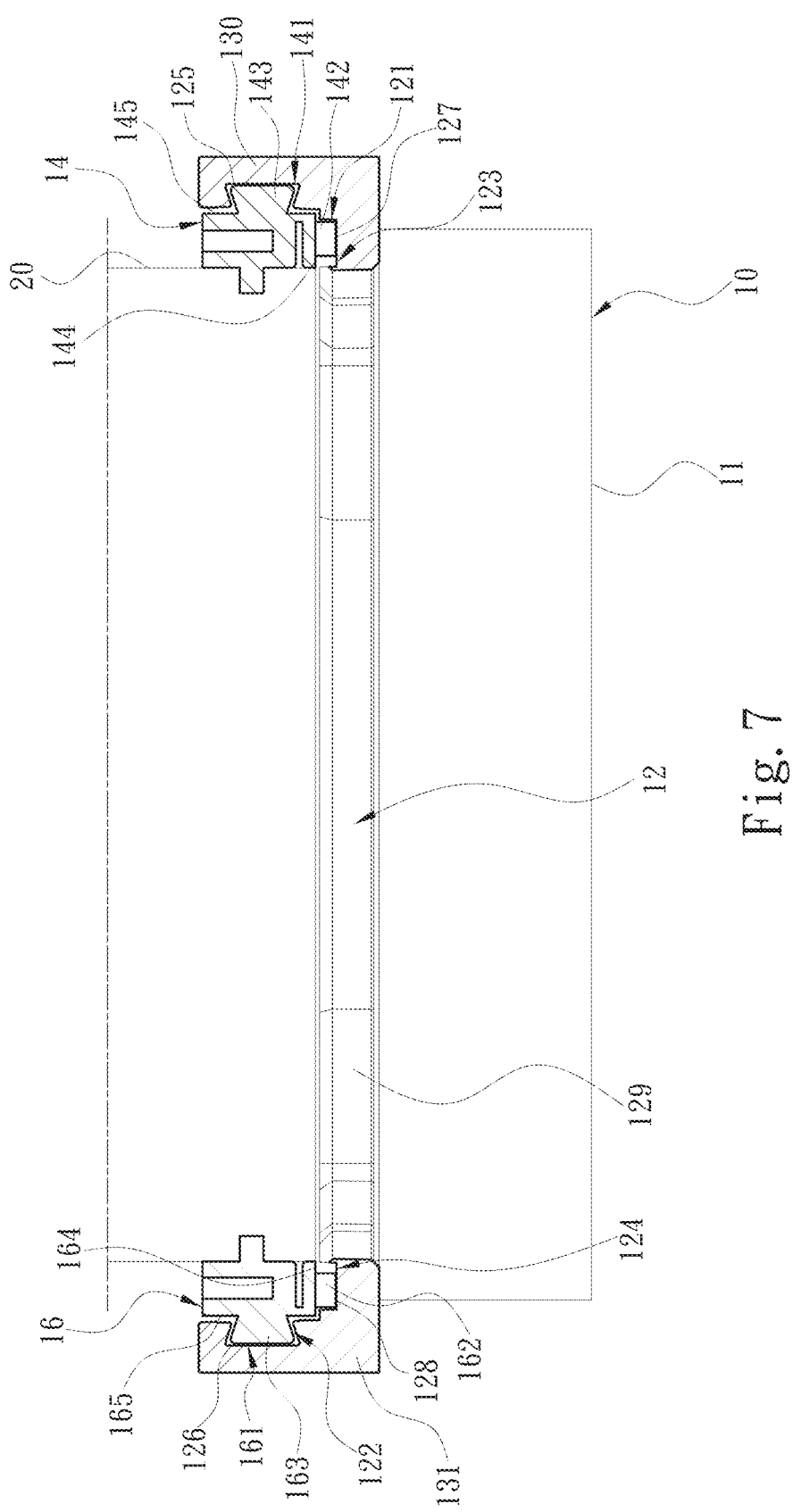
FIG. 7 is another structure cross-sectional view of an embodiment of the present invention.

Please refer to FIGS. 5, 6, and 7. In one embodiment, it is assumed that the relative height between the fan 11 and the passive heat-radiating part 20 is not adjusted initially, i.e. the relative distance between the fan 11 and the passive heat-radiating part 20 is minimum. At this time, the elastic sheet 142 (162) is clamped into one of the positioning points 127 (128), and the guide block 143 (163) is disposed in the guide groove 125 (126), so that the fan 11 can be fixedly attached to the passive heat-radiating part 20. In addition, the elastic sheet 142 (162) is displaced along the track 123 (124) when the active heat-radiating structure 10 is pulled upward by an external force, and the elastic sheet 142 (162) is deformed by the track 123 (124) during the displacement, so that the elastic sheet 142 (162) is displaced from one of the plurality of positioning points 127 (128) which is located at a higher horizontal position toward another positioning points 127 (128) which is located at a lower horizontal position. On the other hand, each of the first connecting portions 121 (122) is also stressed by the external force, and the guide groove 125 (126) is displaced in a direction opposite to the passive heat-radiating part 20 such that a relative movement is appeared between the guide groove 125 (126) and the guide block 143 (163), thereby allowing the fan 11 to change the position relative to the passive heat-radiating part 20 without removal from the passive heat-radiating part 20. Also, when the elastic sheet 142 (162) is displaced to the positioning points 127 (128) located at the lower horizontal position, the elastic sheet 142 (162) is recovered to its original shape by the elastic force thereof, so that the elastic sheet 142 (162) is clamped into and limited the positioning points 127 (128) located at the lower horizontal position and limited by the positioning point 127 (128). At this time, the relative distance between the fan 11 and the passive heat-radiating part 20 is larger, that is, the fan 11 is located at a horizontally higher position than the passive heat-radiating part 20, as shown in FIG. 6. Thereafter, the elastic sheet 142 (162) is able to move continually in the track 123 (124) in accordance with the direction of the external force applied to the active heat-radiating structure 10. For example, the elastic sheet 142 (162) is moved to be clamped into a position of one positioning point 127 (128) which is located at a lower horizontal position when the active heat-radiating structure 10 is pushed and displaced in a direction facing the passive heat-radiating part 20. At the same time, the guide groove 125 (126) is also displaced in the direction facing the passive heat-radiating part 20, causing a relative displacement between the guide block 143 (163) and the guide groove 125 (126). On the other hand, when the active heat-radiating structure 10 is stressed to be displaced in the direction opposite to the passive heat-radiating part 20, the elastic sheet 142 (162) is moved to be clamped into a position of one positioning point 127 (128) which is located at a higher horizontal position, causing a relative displacement between the guide block 143 (163) and the guide groove 125 (126).

As described above, the first connecting portion 121 (122) of the present invention comprises the track 123 (124) and the guide groove 125 (126), and the first mounting portion 141 (161) comprises the elastic sheet 142 (162) and the guide block 143 (163). During an implementation, the guide block 143 (163) is disposed in the guide groove 125 (126) to limit the fan 11, so that the fan 11 is prevented from being separated from the passive heat-radiating part 20. Meanwhile, the elastic sheet 142 (162) is clamped into one of the plurality of positioning points 127 (128) of the track 123 (124), and the height of the fan 11 can be adjusted relative to the passive heat-radiating part 20 by changing the positioning point 127 (128) clamped into by the elastic sheet 142 (162). Referring to FIG. 8, the active heat-radiating structure 10 is provided with the first connecting portions 121 (122) and the first mounting portion 141 (161), so that the active heat-radiating structure 10 is attached to the passive heat-radiating part 20 and adjusted in height relative to the passive heat-radiating part 20. Also, when the present invention is actually applied to a circuit board 30, more external electronic components 40 (e.g., random access memory, RANI, etc.) is allowed to be mounted on the circuit board 30 by adjusting the height position of the active heat-radiating structure 10, and the active heat-radiating structure 10 does not interfere with mounting positions of the external electronic components 40.

In an embodiment, referring to FIGS. 2, 3, 4, 5, and 6, the outer frame 12 comprises a frame body 129 provided with two tracks 123, 124, and two fitting arms 130, 131 respectively connected with the frame body 129 and provided with one of the guide grooves 125 (126). The frame body 129 is disposed at an air inlet side of the fan 11 and annularly arranged on the outer frame of the fan 11, and the frame body 129 is used for disposing the two tracks 123, 124 thereon. The two fitting arms 130, 131 are disposed on a side of the frame body 129 which does not face the fan 11 and are perpendicular to the frame body 129, and the two fitting arms 130, 131 are respectively provided for disposing the guide groove 125 (126) of each first connecting portions 121 (122) at a side which faces the frame body 129, so that the guide groove 125 (126) of each of the first connecting portions 121 (122) faces with one of the tracks 123 (124). On the other hand, each of the mounting members 14 (16) comprises a first side 144 (164) facing the frame body 129 and a second side 145 (165) facing one of the two fitting arms 130, 131. More specifically, each of the mounting members 14 (16) is provided with the elastic sheet 142 (162) at the first side 144 (164); each of the mounting members 14 (16) is assembled to enable the elastic sheet 142 (162) facing one of the tracks 123 (124), so that the fan 11 is adjusted in height relative to the passive heat-radiating part 20. Also, each of the mounting members 14 (16) is provided with the guide block 143 (163) at the second side 145 (165). Each of the mounting members 14 (16) is assembled to face and connect the guide block 143 (163) to one of the guide grooves 125 (126). Therefore, the passive heat-radiating part 20 is prevented from falling off from the fan 11 when being attached to the fan 11. Further, the cross-section of each of the guide blocks 143 (163) may be a dovetail type according to implementation requirements. On the other hand, in an embodiment, one end of each of the guide grooves 125 (126) and one end of each of the tracks 123 (124) are open ends 132 (133), 137 (138), wherein the area of each of the guide grooves 125 (126) at the open end 132 (133) is larger than that of each of the guide grooves 125 (126) elsewhere, thereby facilitating disassembly and assembly of the fan 11 relative to the passive heat-radiating part 20.

On the other hand, referring to FIGS. 2, 5, 6, 7, and 8, in an embodiment, the outer frame 12 comprises two stopping blocks 134, 135, each of the stopping blocks 134 (135) is disposed between one of the two fitting arms 130, 131 and the frame body 129 for limiting a height of each of the mounting members 14 (16) relative to one of the two fitting arms 130, 131. That is, the two stopping blocks 134, 135 are configured for preventing the fan 11 from striking the external electronic component 40 (e.g., RAM, etc.) mounted on the circuit board 30 when the fan 11 is stressed to be displaced in a direction facing the passive heat-radiating part 20. Further, each of the mounting members 14 (16) is formed with at least one clamping hole 146 (166) for disposing one of the elastic sheet 142 (162) therein. In an embodiment, each of the mounting members 14 (16) comprises a limiting structure 147 (167) disposed to one of the clamping holes 146 (166) correspondingly. Each of the limiting structures 147 (167) is configured to limit an assembly position of one of the elastic sheets 142 (162), preventing the elastic sheet 142 (162) from falling off from the clamping hole 146 (166) after being assembled or when being deformed by compression of one of the guide grooves 125 (126).

Accordingly, in an embodiment, each of the elastic sheets 142 (162) comprises a bent section 148 (168) and two straight sections 149 (169) respectively extending from the bent section 148 (168). The bent section 148 (168) contacts one of the guide grooves 125 (126) and is compressed to deform as the elastic sheet 142 (162) slides within one of the tracks 123 (124). In addition, the straight sections 149 (169) are disposed at both ends of the elastic sheet 142 (162) and clamped into the clamping hole 146 (166) such that the elastic sheet 142 (162) is connected into the clamping holes 146 (166) and disposed at one of the two mounting members 14, 16. In addition, referring to FIGS. 1, 2, and 3, in an embodiment, each of the mounting members 14 (16) comprises two connecting arms 150 (170) extended from both ends respectively. The connecting arms 150, 170 are configured to connect the passive heat-radiating part 20, and the distance between the two connecting arms 150 (170) corresponds to the height of the passive heat-radiating part 20. Further, the connecting arms 150, 170 allow each of the mounting members 14 (16) to be assembled to the passive heat-radiating part 20 by at least one connecting members 50 (51). On the other hand, in an embodiment, the outer frame 12 is provided with a plurality of through holes 136 respectively formed in the frame body 129, and the plurality of through holes 136 are respectively configured for a fan fastener 60 to penetrate to provide an assembling position at which the fan 11 can be fixed to the frame body 129.

What is claimed is:

1. An active heat-radiating structure attached to a passive heat-radiating part, comprising:
    a fan;
    an outer frame, provided for the fan to be disposed thereon, the outer frame including two first connecting portions arranged at two opposite sides of the outer frame; and
    two mounting members, disposed on the passive heat-radiating part in parallel and at an interval, and the two mounting members forming a connecting relationship with the outer frame, each of the mounting members provided with a first mounting portion facing the outer frame and one of the two first connecting portions;
    wherein each of the first connecting portions comprises a track provided with a plurality of positioning points and a guide groove disposed in parallel with the track, and each of the first mounting portions comprises at least one elastic sheet which can be stressed to move on the track and limited by one of the positioning points, and a guide block which can be stressed to slide in the guide groove; and a position of the fan relative to the passive heat-radiating part is adjustable based on a relative movement between the two first connecting portions and the two first mounting portions.

2. The active heat-radiating structure attached to the passive heat-radiating part of claim 1, wherein the outer frame comprises a frame body connected with the fan and provided with the two tracks, and two fitting arms positioned at two opposite sides of the frame body and perpendicular to the frame body, each of the fitting arms is provided with one of the guide grooves, and each of the mounting members comprises a first side facing the frame body and provided with the elastic sheet, and a second side facing one of the two fitting arms and provided with the guide block.

3. The active heat-radiating structure attached to the passive heat-radiating part of claim 2, wherein one end of each of the tracks and one end of each of the guide grooves are open ends.

4. The active heat-radiating structure attached to the passive heat-radiating part of claim 3, wherein the outer frame is provided with a plurality of through holes which are respectively formed in the frame body and provided for a fan fastener to penetrate through.

5. The active heat-radiating structure attached to the passive heat-radiating part of claim 3, wherein each of the mounting members is formed with at least one clamping hole for disposing the elastic sheet therein.

6. The active heat-radiating structure attached to the passive heat-radiating part of claim 5, wherein each of the elastic sheets comprises a bent section and two straight sections respectively extending from two ends of the bent section and clamped into each of the clamping holes.

7. The active heat-radiating structure attached to the passive heat-radiating part of claim 6, wherein each of the tracks is provided with a plurality of recesses arranged at intervals to form the plurality of positioning points.

8. The active heat-radiating structure attached to the passive heat-radiating part of claim 7, wherein each of the mounting members comprises two connecting arms respectively extended from both ends respectively.

9. The active heat-radiating structure attached to the passive heat-radiating part of claim 1, wherein each of the tracks is provided with a plurality of recesses arranged at intervals to form the plurality of positioning points.

10. The active heat-radiating structure attached to the passive heat-radiating part of claim 1, wherein each of the mounting members comprises two connecting arms respectively extended from both ends respectively.

* * * * *